(12) United States Patent
Barnes et al.

(10) Patent No.: US 12,051,759 B2
(45) Date of Patent: Jul. 30, 2024

(54) PHOTOVOLTAIC SOLAR COLLECTION SYSTEM AND NATURAL ILLUMINATION APPARATUS FOR BUILDING INTEGRATION

(71) Applicant: MORGAN SOLAR INC., Toronto (CA)

(72) Inventors: Brett Barnes, Toronto (CA); Stephen Caelers, Toronto (CA); Philip Chang, Toronto (CA); Xing Yi Li, Woodbridge (CA); John Paul Morgan, Toronto (CA); Stefan Myrskog, Maple (CA); Muny Tram, Toronto (CA)

(73) Assignee: MORGAN SOLAR INC., Toronto (CA)

( * ) Notice: Subject to any disclaimer, the term of this patent is extended or adjusted under 35 U.S.C. 154(b) by 136 days.

(21) Appl. No.: 17/640,414

(22) PCT Filed: Sep. 5, 2019

(86) PCT No.: PCT/IB2019/057493
§ 371 (c)(1),
(2) Date: Mar. 4, 2022

(87) PCT Pub. No.: WO2021/044195
PCT Pub. Date: Mar. 11, 2021

(65) Prior Publication Data
US 2022/0336688 A1 Oct. 20, 2022

(51) Int. Cl.
*H02S 20/32* (2014.01)
*H01L 31/054* (2014.01)
*H01L 31/068* (2012.01)

(52) U.S. Cl.
CPC .......... *H01L 31/0547* (2014.12); *H02S 20/32* (2014.12); *H01L 31/0684* (2013.01)

(58) Field of Classification Search
CPC ....... H01L 31/00–078; Y02E 10/50–60; H02S 20/30–32; H02S 40/20–22
(Continued)

(56) References Cited

U.S. PATENT DOCUMENTS

| 2001/0008144 A1* | 7/2001 | Uematsu | ............. | H01L 31/0236 136/246 |
| 2011/0197968 A1* | 8/2011 | Montgomery | ...... | H01L 31/0547 136/259 |

(Continued)

FOREIGN PATENT DOCUMENTS

WO 2012101237 A2 8/2012

OTHER PUBLICATIONS

European Search Report from EP 19 94 4633, Le Masson, Nicolas, Aug. 11, 2023.
(Continued)

*Primary Examiner* — Bach T Dinh
(74) *Attorney, Agent, or Firm* — BCF LLP (57) ABSTRACT

An optical collection apparatus includes a plurality of light transmissive optical reflectors and a plurality of planar bifacial solar cells. Each light transmissive optical reflector is configured to transmit indirect light impinging on first and second collection sides thereof. First and second photovoltaic sides of each of the plurality of bifacial solar cells are positioned to collect indirect light impinging thereon. The planar bifacial solar cells are arranged such that at least one light transmissive optical reflector of the plurality of light transmissive optical reflectors is positioned between consecutive ones of the planar bifacial solar cells. Each light transmissive optical reflector of the plurality of light transmissive optical reflectors is configured to reflect direct incoming light impinging on the first collection side thereof towards the first photovoltaic side of a corresponding one of (Continued)

the planar bifacial solar cells. A solar collection and shading system is also contemplated.

12 Claims, 10 Drawing Sheets

(58) Field of Classification Search
USPC .................................................. 136/243–265
See application file for complete search history.

(56) References Cited

U.S. PATENT DOCUMENTS

| | | | |
|---|---|---|---|
| 2012/0222722 A1* | 9/2012 | Baruchi | H01L 31/0547 |
| | | | 136/246 |
| 2014/0230897 A1 | 8/2014 | Waldman et al. | |
| 2014/0261630 A1* | 9/2014 | Morgan | H01L 31/02008 |
| | | | 136/246 |
| 2016/0054588 A1 | 3/2016 | Paull et al. | |
| 2021/0173141 A1* | 6/2021 | Dhar | F24S 23/75 |

OTHER PUBLICATIONS

International Search Report from PCT/IB2019/057493 dated Jun. 24, 2020, Shane Thomas.

* cited by examiner

PHOTOVOLTAIC SOLAR COLLECTION SYSTEM AND NATURAL ILLUMINATION APPARATUS FOR BUILDING INTEGRATION

TECHNICAL FIELD

The present technology relates generally to solar collection systems, particularly to an optical collection photovoltaic system and tracking system thereof.

BACKGROUND

In the field of solar energy, conventional photovoltaic panels are used to generate electric power from sunlight. Conventional photovoltaic panels consist of arrays of photovoltaic cells, with each cell consisting of a semiconductor (e.g. monocrystalline silicon or polycrystalline silicon) substrate. The photovoltaic cells collect solar energy and convert it into an electric current, where the power output from such conventional photovoltaic panels is a direct function of the total substrate area of the array and its orientation with respect to the normal direction of sunlight. As a result, sizeable arrays of large, semiconductor substrates are typically needed to generate sufficient electrical output, or these may be mounted on tracking systems to position the panels in the most efficient direction with respect to the sun.

There has been research and product development for many alternative methods of harvesting the energy from the sun to produce electric energy. In the field of building integrated photovoltaics, the efficiency of semiconductor substrates can be maximized by using optical elements such as lenses and reflectors to direct more light onto said substrates. The optical elements collect light and direct the light towards a photovoltaic cell. The optical elements can be made of inexpensive materials such as mirrors, glass or polymers to achieve competitive prices.

Such photovoltaic panels have been integrated into certain commercial and residential buildings to produce energy from the sunlight collected by the photovoltaic panels. However, typically, these types of panels also absorb or block all incoming direct and diffuse light.

Therefore it is desirable to develop a system which could be used in a structure and placed over windows or skylights, for example, and that would allow some diffuse natural light to enter the building for illumination, while most light is collected by the panels to generate energy. It is therefore an object at least to provide an optical collection photovoltaic panel for building integration which addresses at least some of these drawbacks.

U.S. Pat. No. 9,151,879 to Boer et al. describes a building-integrated photovoltaic system having a cylindrical lens array used in combination with strip solar cells and lateral displacement tracking systems, permitting diffuse light to pass through to the interior of the building, where the strip solar cells may absorb direct light and convert it to electricity. The system described by Boer uses optic lenses that focus light directly onto the strip solar cells, adding the requirement of a frame to hold the components apart from each other such that the solar strips are positioned at the depth of the focus of the lenses.

US Patent Application Publication 2011/0277819 A1 to Schuelov describes bifacial solar cell panels and associated systems wherein the panels include a plurality of semiconductor cells and a reflector is used to reflect light towards the backside of the panel, wherein the bifacial cell can absorb light from both sides. The system described by Schuelov uses half cylindrical reflectors that also have depth requirements and block incoming light impinging on the lower portion of the reflector.

Improvements are generally desired, in order to obtain a compact, aesthetic, and efficient solar panel, for providing natural illumination to the interior of buildings while producing electric power from sunlight. It is therefore an object at least to provide a novel concentrated photovoltaic panel.

SUMMARY

It is an object of the present technology to ameliorate at least some of the inconveniences present in the prior art.

According to an aspect of the present technology, there is provided an optical collection apparatus. The optical collection apparatus comprises: a plurality of light transmissive optical reflectors, each light transmissive optical reflector comprising a first collection side and a second collection side, each light transmissive optical reflector being configured to transmit indirect light impinging on the first and second collection sides thereof; and a plurality of planar bifacial solar cells, each bifacial solar cell comprising a first photovoltaic side and a second photovoltaic side, the first and second photovoltaic sides of each of the plurality of bifacial solar cells being positioned to collect indirect light impinging thereon. The planar bifacial solar cells of the plurality of planar bifacial solar cells are arranged such that at least one light transmissive optical reflector of the plurality of light transmissive optical reflectors is positioned between consecutive ones of the planar bifacial solar cells. Each light transmissive optical reflector is configured to reflect direct incoming light impinging on the first collection side thereof towards the first photovoltaic side of a corresponding one of the planar bifacial solar cell.

In some embodiments, the second collection side of each of the light transmissive optical reflectors comprises an optical film configured to reflect direct light by total internal reflection towards the first photovoltaic side of the corresponding one of the bifacial solar cells.

In some embodiments, the second collection side of each of the light transmissive optical reflectors comprises a patterned surface of prismatic micro-reflectors for reflecting direct light by total internal reflection towards the first photovoltaic side of the corresponding one of the bifacial solar cells.

In some embodiments, each of the light transmissive optical reflectors is shaped and positioned to transmit indirect light impinging on the first collection side and on the second collection side to the first photovoltaic side and second photovoltaic side of one of the bifacial solar cells.

In some embodiments, the first collection side of each of the light transmissive optical reflectors is a concave side and the second collection side of each of the light transmissive optical reflectors is a convex side.

In some embodiments, a cross-sectional profile of each of the light transmissive optical reflectors is curvilinear in shape.

In some embodiments, the light transmissive optical reflectors are planar elongated sheets of light transmissive material.

In some embodiments, the plurality of light transmissive optical reflectors includes a plurality of subsets of light transmissive optical reflectors. For each subset of light transmissive optical reflectors of the plurality of subsets of light transmissive optical reflectors: the light transmissive optical reflectors are disposed side by side horizontally; and the light transmissive optical reflectors are attached to a common one of the planar bifacial solar cells and are in a fixed position with respect to the common one of the planar bifacial solar cells.

In some embodiments, each of the light transmissive optical reflectors is arranged in a fixed position with respect to the corresponding one of the bifacial solar cells to form a plurality of solar collection units. The solar collection units of the plurality of solar collection units are vertically adjacent to one another.

In some embodiments, each of the light transmissive optical reflectors is arranged in a fixed position with respect to the corresponding one of the bifacial solar cells. The light transmissive optical reflectors are arranged in an array having rows and columns of the light transmissive optical reflectors.

In some embodiments, the optical collection apparatus further comprises a transparent case for enclosing the plurality of light transmissive optical reflectors and the plurality of planar bifacial solar cells therein.

In some embodiments, the optical collection apparatus is configured to be mounted on a single-axis tracking system for positioning the light transmissive optical reflectors such that the first collection sides thereof face the sun in order to receive direct incoming light therefrom.

According to another aspect of the present technology, there is provided at least one elongated light transmissive prismatic optical reflector and at least one planar bifacial solar cell. The at least one elongated light transmissive optical reflector is shaped and positioned to transmit light to the at least one planar bifacial solar cell.

In some embodiments, each of the at least one planar bifacial solar cell comprises a first photovoltaic side and a second photovoltaic side. The first photovoltaic side of each of the at least one planar bifacial solar cell is positioned to receive direct light having been reflected by a corresponding one of the at least one elongated light transmissive optical reflector.

In some embodiments, each of the at least one planar bifacial solar cell comprises a first photovoltaic side and a second photovoltaic side. Each of the at least one elongated light transmissive optical reflector is shaped and positioned to transmit indirect light to at least one of the first photovoltaic side and the second photovoltaic side of one of the at least one planar bifacial solar cell.

In some embodiments, each of the at least one elongated light transmissive optical reflector is shaped to provide illumination by refraction of indirect light impinging thereon and being transmitted therethrough such as to avoid the at least one planar bifacial solar cell.

In some embodiments, the at least one elongated light transmissive optical reflector and the at least one bifacial solar cell are mounted on a single axis tracking system for adjusting a position of the at least one elongated light transmissive optical reflector and the at least one planar bifacial solar cell in accordance with a position of the sun. The position of the at least one elongated light transmissive optical reflector and the at least one planar bifacial solar cell is adjusted to optimize collection of direct light from the sun by the at least one planar bifacial solar cell.

In some embodiments, the at least one elongated light transmissive optical reflector is mounted on a single axis tracking system for adjusting a position of the at least one elongated light transmissive optical reflector in accordance with a position of the sun. The position of the at least one elongated light transmissive optical reflector is adjusted to optimize collection of direct light from the sun by the at least one planar bifacial solar cell.

According to another aspect of the present technology, there is provided a solar collection and shading system. The solar collection and shading system comprises: a plurality of bifacial solar cells spaced apart from one another to define respective gaps between consecutive bifacial solar cells of the plurality of bifacial solar cells; and a plurality of light transmissive optical redirecting elements having a first surface and a second surface opposite the first surface, each light transmissive optical redirecting element of the plurality of light transmissive optical redirecting elements being positioned in one of the gaps defined between the consecutive bifacial solar cells. Each light transmissive optical redirecting element of the plurality of light transmissive optical redirecting elements is shaped and positioned to: redirect a first portion of light incident on the first surface thereof towards a corresponding bifacial solar cell of the plurality of bifacial solar cells; and transmit a second portion of light incident on the first surface thereof through the light transmissive optical redirecting element from the first surface to the second surface.

In some embodiments, the first portion of light is direct sunlight, and the second portion of light is diffuse light.

In some embodiments, each light transmissive optical redirecting element is shaped and positioned to redirect the first portion of light by total internal reflection.

In some embodiments, each light transmissive optical redirecting element is shaped and positioned to redirect the first portion of light via a transparent microstructure formed on the second surface.

In some embodiments, each light transmissive optical redirecting element has a length and a width; each bifacial solar cell has a length and a width; and the length of each light transmissive optical redirecting element is approximately the same as the length of each bifacial solar cell.

In some embodiments, the width of each light transmissive optical redirecting element is approximately the same as the width of each bifacial solar cell.

In some embodiments, each light transmissive optical redirecting element is rotatable about a respective single axis.

In some embodiments, each bifacial solar cell is rotatable about a respective single axis.

In some embodiments, direct sunlight is blocked by the plurality of light transmissive optical redirecting elements from passing from the first surfaces to the second surfaces thereof.

Embodiments of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of embodiments of the present technology will become apparent from the following description, the accompanying drawings and the appended claims.

BRIEF DESCRIPTION OF THE DRAWINGS

Embodiments will now be described more fully with reference to the accompanying drawings in which.

DETAILED DESCRIPTION

For a better understanding of various features of the present technology, reference is made to the following description which is accompanied by FIGS. 1A to 8.

With reference to FIGS. 1A to 3, a non-limiting example of an optical collection apparatus 10 for harvesting solar light is described. A person skilled in the art would understand that modifications to the embodiments described below are possible, and necessary for specific applications, and the descriptions below are meant to be mere examples of an optical collection apparatus of the present technology.

Furthermore, it is to be understood that, in the context of the present description, the term "direct light" refers to light travelling directly from a light source, such as the sun. Direct light provides angles of incidence suitable for total internal reflection. On other hand, "indirect light" (also referred to as "diffuse light") is scattered and comes from all directions, and has neither the intensity nor the glare of direct light.

Figure 1A:
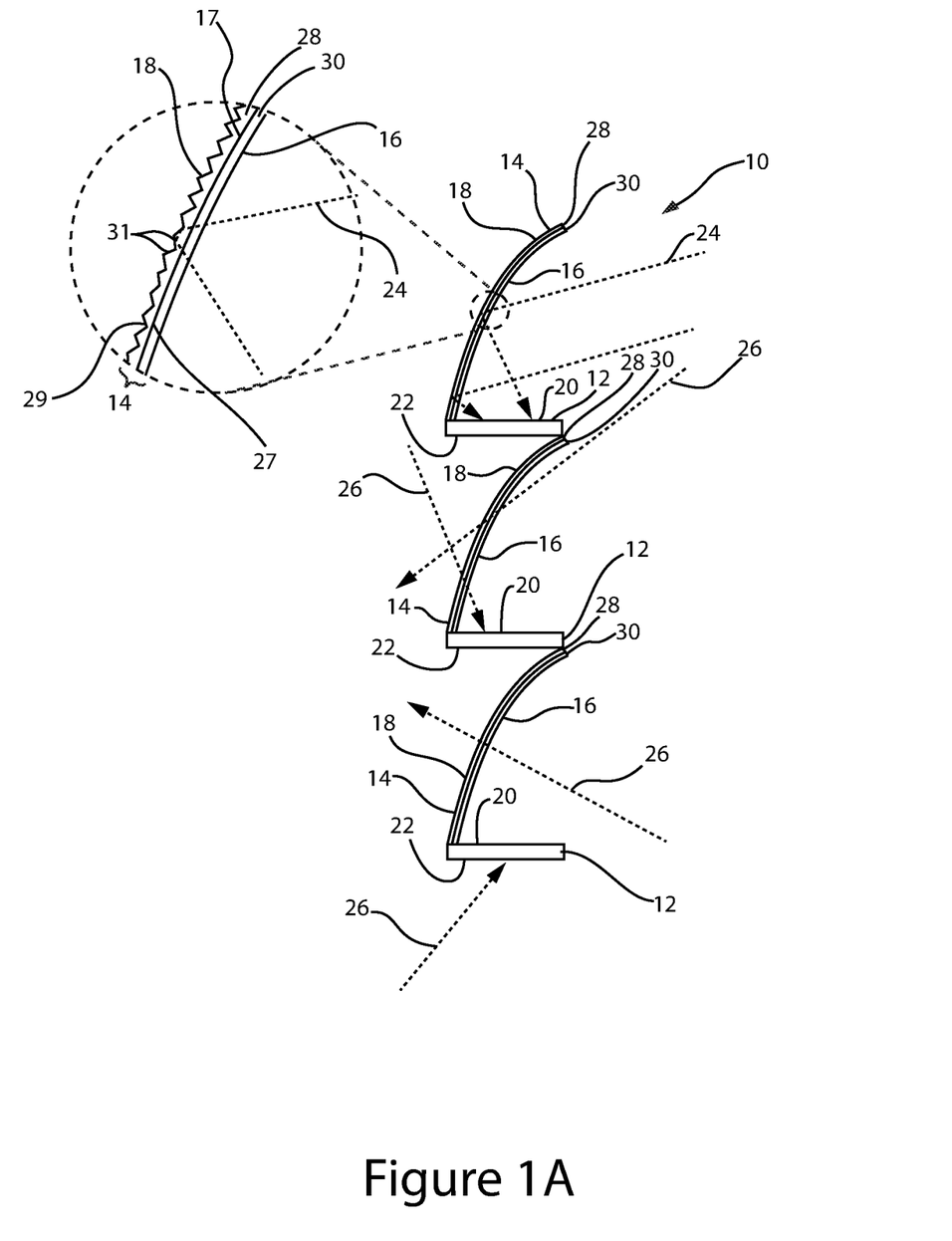
FIG. 1A is a cross sectional view of an optical collection apparatus.

FIG. 1A shows a cross-sectional view of an optical collection apparatus 10 for collecting light from the sun onto a plurality of bifacial solar cells 12. The optical collection apparatus 10 comprises three light transmissive optical reflectors 14 (also referred to as "optical redirecting elements") and three bifacial solar cells 12. In this embodiment, each light transmissive optical reflector 14 comprises a curved sheet of light transmissive material 30, a first collection side or surface 16 and a second collection side or surface 18. The curved sheets of light transmissive material 30 each comprise a transmission surface 17, to which a reflective optical film 28 is attached to form the second collection side 18 of the optical reflectors 14. The curved sheets of light transmissive material 30 provide structure and rigidity to the light transmissive optical reflectors 14. The curved sheets of light transmissive material 30 are made of glass or polymer. The curved sheets 30 and the optical films 28 are made of light transmissive materials which are translucent when diffuse light impinges thereon. In this embodiment, the light transmissive material from which the curved sheets 30 and the optical films 28 are made is poly(methyl methacrylate) PMMA. It is contemplated that any other suitable light transmissive material may be used in other embodiments. For example, the curved sheets 30 could alternatively be composed of polycarbonate or glass, and the optical films 28 could alternatively be composed of polycarbonate or polyethylene terephthalate (PET). The light transmissive optical reflectors 14 are highly reflective (by total internal reflection (TIR)) when light impinges thereon at specific angles of incidence.

The light transmissive optical reflectors 14 are curved in cross section. Notably, the first collection side 16 of each light transmissive optical reflector 14 is concave, and the second collection side 18 of each light transmissive optical reflector 14 is convex. In particular, in this embodiment, a cross-sectional profile of each light transmissive optical reflector 14 is curvilinear in shape. A width of each optical reflector 14 is measured as a straight line distance between the two ends of the cross-sectional profile thereof. A length of each light transmissive optical reflector 14 is measured between opposite longitudinal ends thereof (perpendicular to the cross-sectional profile of the light transmissive optical reflector 14). The optical film 28 disposed on the transmission surface 17 of each curved sheet 30, comprises a smooth surface 27 for attaching the optical film 28 to the transmission surface 17, and comprises a prismatic surface 29 opposite to the smooth surface 27. The prismatic surface 29 comprises a prismatic microstructure 31 (which can also be referred to as "prismatic micro-reflectors") which is highly reflective (by TIR) when light impinges thereon at certain (direct) angles of incidence, and highly transmissive when light impinges thereon at other (indirect) angles of incidence. The critical angle for TIR is determined by the microstructure 31 of the prismatic surface 29. The optical film 28 is designed to receive direct incoming light 24 (i.e., incoming sunlight) travelling towards the prismatic surface 29 via the first collection side 16 of an optical reflector 14, wherein the light 24 having passed through the first collection side 16 is reflected by the microstructure 31 of the prismatic surface 29 and redirected back through the first collection side 16 towards the first photovoltaic side 20 of a corresponding bifacial solar cell 12 associated with and attached to the light transmissive optical reflector 14.

The bifacial solar cells 12 are elongated sheets or strips of substrate material, comprising photovoltaic material, such as crystalline silicon semiconductors, on a first photovoltaic side 20 and on a second photovoltaic side 22 thus providing a capability to absorb light impinging on both sides 20, 22 of the bifacial solar cells 12 and generate power. Each bifacial solar cell 12 has a length measured between opposite longitudinal ends thereof. In this embodiment, the length of each bifacial solar cell 12 is approximately the same as the length of each optical reflector 14. A width of each bifacial solar cell 12 is measured between opposite ends of a cross-sectional profile thereof (shown in FIG. 1A for example). While in this embodiment the width of the transmissive optical reflectors 14 is greater than the width of the bifacial solar cells 12, the widths of the transmissive optical reflectors 14 and of the bifacial solar cells 12 may be approximately the same, as will be seen in another embodiment further below. Each light transmissive optical reflector 14 works in conjunction with a corresponding one of the bifacial solar cells 12, and that bifacial solar cell 12 is attached to the corresponding optical reflector 14 in a fixed position, such that direct light 24 impinging on the first collection 16 side is transmitted towards the prismatic surface 29 of the optical film 28 and is thereby reflected towards the first photovoltaic side 20 of the corresponding bifacial solar cell 12. The prismatic microstructure 31 of the optical film 28 is designed to receive direct incoming light 24 impinging on the first collection side 16 of the optical reflectors 14 at an angle of incidence which will bring about total internal reflection on the microstructure 31 of the optical film 28, wherein direct light 24 is thereby redirected to the first photovoltaic side 20 of the corresponding bifacial solar cell 12. The shape of the curved sheet of light transmissive material 30 is optimized to promote total internal reflection on the second collection side 18 of the optical reflectors 14. Details of the prismatic optical film 28 and its prismatic microstructure 31 can be seen in the zoomed-in view of FIG. 1A.

The solar cells 12 are positioned within a light collection area determined by the shape and materials of the light transmissive optical reflectors 14, with the first photovoltaic side 20 facing the first collection side 16 of the corresponding optical reflector 14. This allows for all direct incoming light 24 reflected by the optical film 28 of an optical reflector 14 to be absorbed by the first photovoltaic side 20 of each corresponding bifacial solar cell 12.

In practice, light is scattered in all directions by objects and surfaces in any environment, creating a background of indirect light 26 (also commonly referred to as "diffuse light"). This indirect light 26 will also impinge on the first collection side 16 and on the second collection side 18 of the optical reflectors 14. Notably, as shown in FIG. 1A, a portion of indirect light 26 will be transmitted through and out the opposite side of the optical reflectors 14 to the first photovoltaic sides 20 of the corresponding bifacial solar cells 12, and a portion of the indirect light 26 will be absorbed by the first photovoltaic sides 20 and second photovoltaic sides 22 of the bifacial solar cells 12 (without having passed through the optical reflectors 14), increasing the overall efficiency in power generation of the optical collection apparatus 10. Indirect light 26 can also pass through the reflectors 14 without subsequently impinging on the bifacial solar cells 12, providing natural illumination or distorted transparency. Because direct rays of light are collected by the system, this is also an efficient system for providing shade or illumination without glare. Although the rays depicted in FIG. 1A are shown in two dimensions with negligible angles of refraction, it should be noted that some rays of the indirect light 26 will be transmitted with considerable angles of refraction, and others will be refracted out of the depicted two-dimensional plane (out of the page).

Figure 2A:
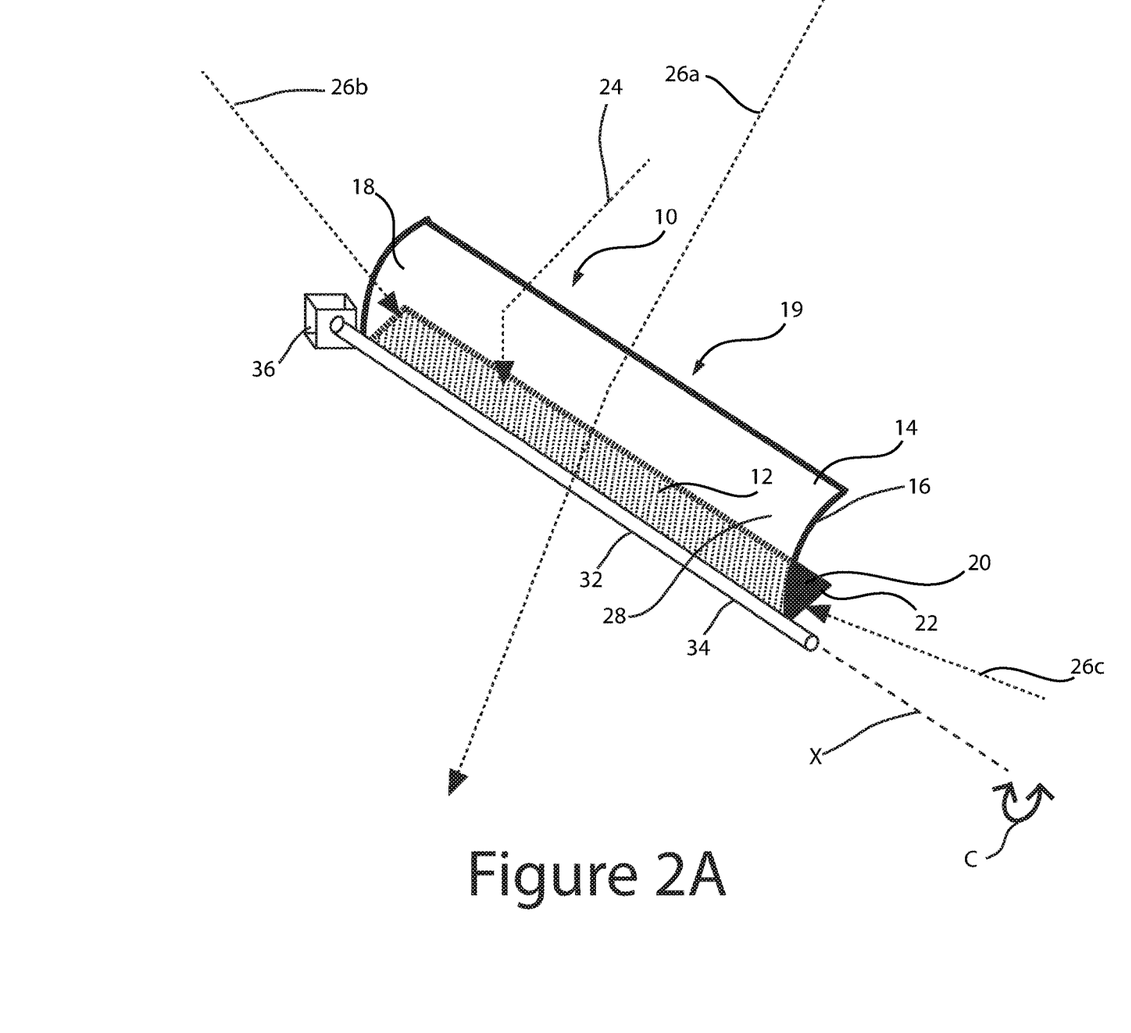
FIG. 2A is a perspective view of one of the solar connection units of the optical collection apparatus of FIG. 1A, with the solar connection unit being tilted about an axis defined by a rotation arm of a corresponding tracking system.

In order for the optical collection apparatus 10 to reflect direct light 24 towards the first photovoltaic side 20 of the bifacial solar cells 12, the light transmissive optical reflectors 14 can be tilted such that the first collection side 16 can receive the rays of the incoming direct light 24 at angles appropriate for total internal reflection by the optical film 28. Depending on the general orientation of the optical collection apparatus 10 within a structure 40, such as for example a building 40 (shown in FIG. 3), and the geographic location, the optical reflectors 14 may be able to redirect all or most of the rays of direct light 24 towards the bifacial solar cells 12 while held in a single fixed position. In other orientations and geographic locations, the orientation of the optical reflectors 14 may be adjusted continually or at fixed intervals to track the sun's path through the sky. In such embodiments, in order to achieve proper orientation of the optical collection apparatus 10, each fixed pair of an optical reflector 14 and its corresponding bifacial solar cell 12, which shall be referred to as a solar collection unit 19, can be mounted on a single-axis tracking system 32. As shown in FIG. 2A, the single axis tracking system 32 comprises a rotation arm 34 for each solar collection unit 19, and a motor system 36 for rotating the solar collection unit 19 about an axis X defined by the rotation arm 34. The motor system 36 can be powered with electricity generated by indirect light 26 impinging on the first photovoltaic side 20 and the second photovoltaic side 22 of the bifacial solar cells 12.

Figure 1B:
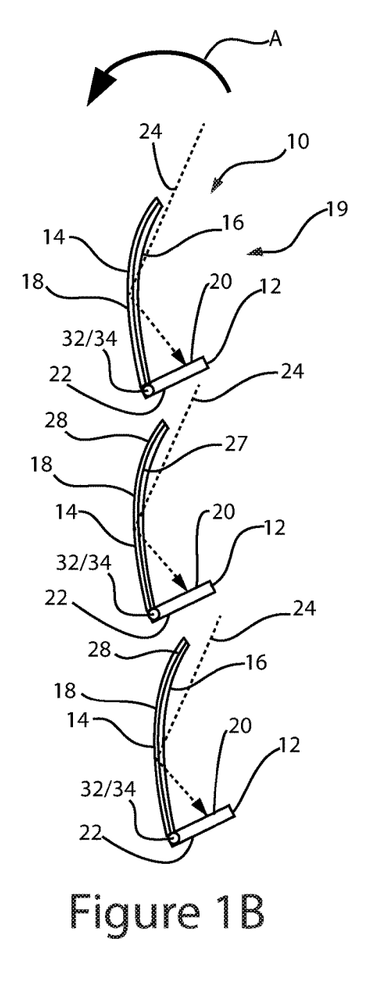
FIG. 1B is a cross sectional view of the optical collection apparatus of FIG. 1A at a time where solar connection units thereof are rotated about respective axes in a first direction.
Figure 1C:
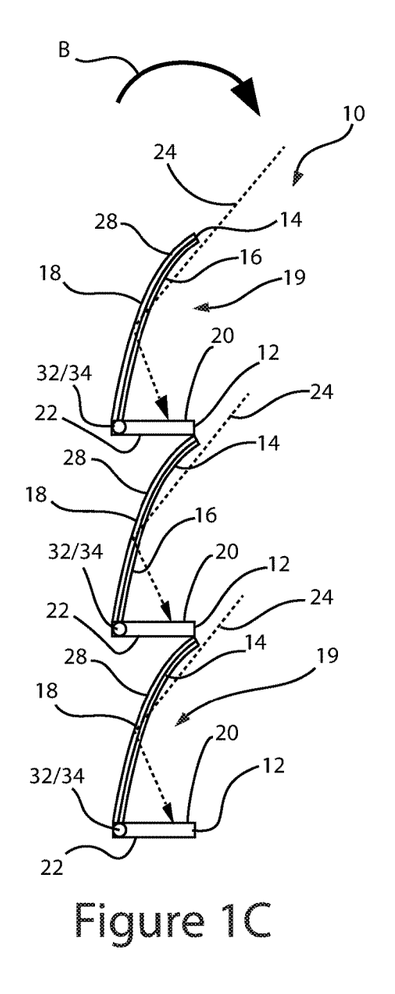
FIG. 1C is a cross sectional view of the optical collection apparatus of FIG. 1A at a time where the solar connection units thereof are rotated back about their respective axes in a second direction opposite to the first direction.

FIGS. 1B and 1C show a cross sectional view of an optical collection apparatus 10, wherein the axis X defined by a length of each rotation arm 34 points out of the page. In particular, FIG. 1B shows a time A where the solar collection units 19 are tilted towards the left side of the page or rotated around the axes X defined by the rotation arms 34 in the direction shown by arrow A, and FIG. 1C shows a time B where the solar collection units 19 are tilted back towards the right side of the page around the axes X defined by the rotation arms 34 in the direction shown by arrow B. Indirect light 26 also impinges on both sides of the optical reflectors 14 when the sun is at a position where the first collection side 16 cannot face the sun. This indirect light 26 can either be absorbed by the first and second photovoltaic sides 20, 22 of the bifacial solar cells 12, or the indirect light 26 can pass through the light transmissive optical reflectors 14 by transmission, providing natural illumination or distorted transparency. Because direct rays of light are collected by the system, this is also an efficient system for providing shade or illumination without glare, which could be useful for greenhouses and living areas.

FIG. 2A shows a perspective view of a solar collection unit 19 as described and shown in FIGS. 1A-1C. In this embodiment, the light transmissive optical reflector 14 is an elongated light transmissive optical reflector 14, and the bifacial solar cell 12 is an elongated bifacial solar cell 12. The solar collection unit 19 is mounted on a single-axis sun tracking system 32 comprising a rotation arm 34 and a motor system 36 for rotating the rotation arm 34, thereby rotating the entire solar collection unit 19 to face the sun 42 as it moves in the sky, such that the first collection side 16 of the light transmissive optical reflector 14 can be oriented towards the sun 42, and thereby reflect direct light 24 onto the bifacial solar cell 12. One exemplary ray of direct light 24 is shown to be reflected by the optical reflector 14 onto the first photovoltaic side 20 of the bifacial solar cell 12. A first ray 26a of indirect light 26 is shown to impinge on the first collection side 16, and be transmitted by refraction out through the second collection side 18 of the light transmissive optical reflector 14. A second ray 26b of indirect light 26 is shown to impinge on the second collection side 18 of the light transmissive optical reflector 14 and be transmitted out through the first collection side 16 towards the first photovoltaic side 20 of the bifacial solar cell 12, by which the ray 26b is absorbed to produce electricity. Refraction of the indirect ray 26b is omitted from FIG. 2A in order to simplify explanation and show that the indirect ray 26b can pass through a light transmissive optical reflector 14 and impinge on the first photovoltaic side 20 of a corresponding bifacial solar cell 12. In any case, a person skilled in the art should assume that some refraction would occur at any surface where there is a change in refractive index. In this case, large deviation angles may be caused by the structure of the optical film 28 at the level of the. A third ray 26c of indirect light 26 simply impinges on the second photovoltaic side 22 of the solar cell 12 and is absorbed thereby to produce electricity.

Figure 2B:
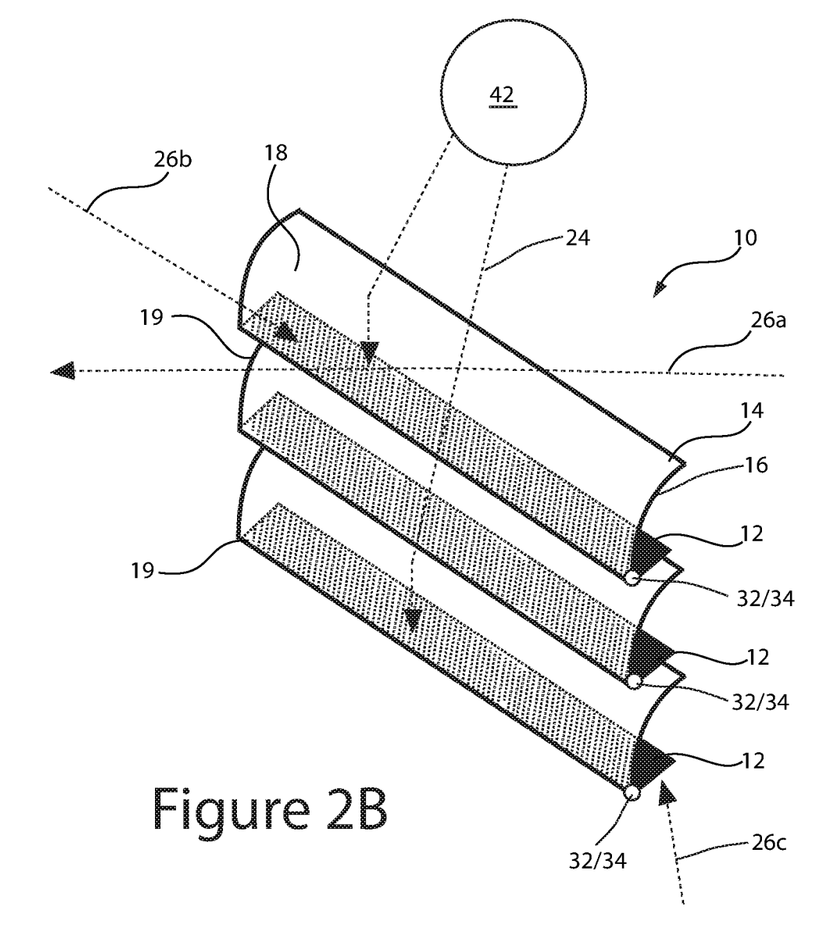
FIG. 2B is a perspective view of the optical collection apparatus of FIG. 1A.
Figure 3:
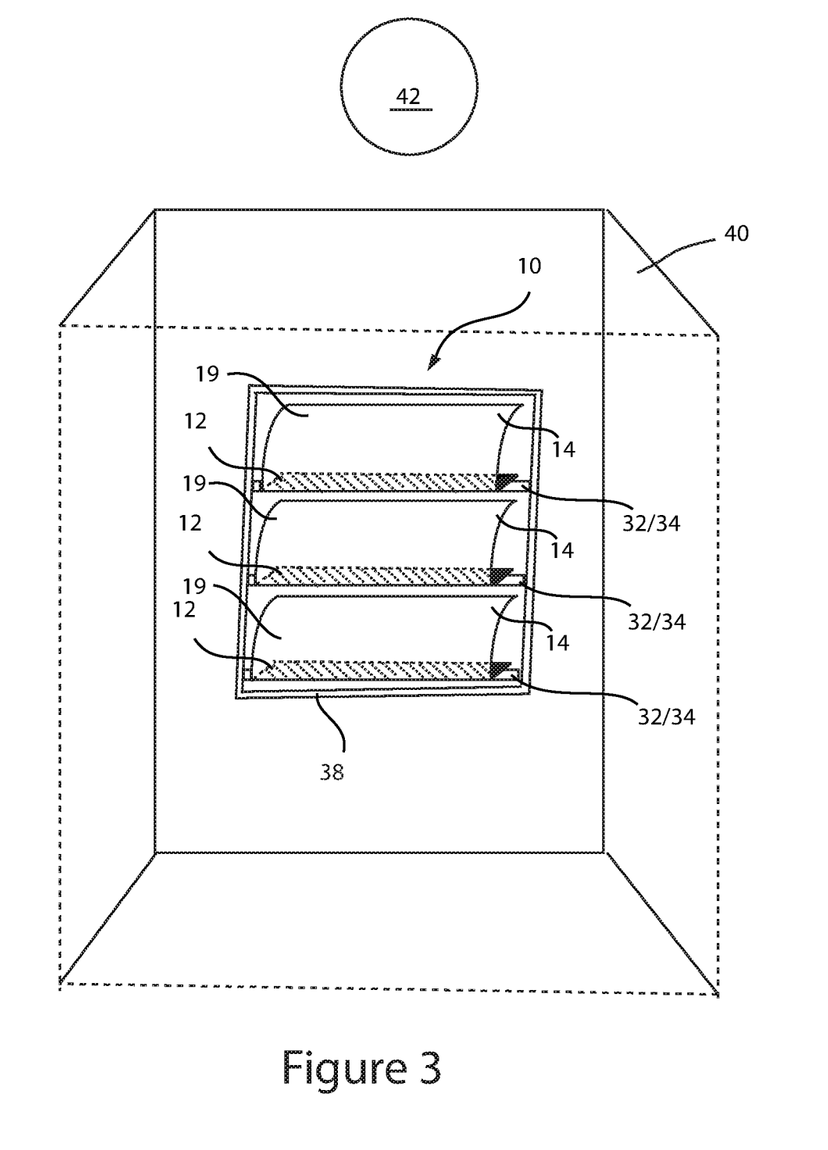
FIG. 3 is a perspective view of the optical collection apparatus of FIG. 1A mounted at a window on the side of a building.

The solar collection unit 19 can be tilted around the axis X defined by the length of the rotation arm 34, in order to place the light transmissive optical reflector 14 in a position where direct incoming light 24 can be reflected onto the first photovoltaic side 20 of the corresponding bifacial solar cell 12. Rotation of the solar collection unit 19 around the axis X defined by the rotation arm 34 in FIG. 2A is shown by arrow C. FIG. 2B shows a perspective view of the optical collection apparatus 10 comprising three solar collection units 19 as described above, such that FIGS. 1A-1C represent cross-sectional views of the embodiment of FIG. 2B. Furthermore, FIG. 3 shows a perspective view of the optical collection apparatus 10 mounted on a window frame 38, within the building 40 or other structure. If the window 38 is facing east, the solar collection units 19 will be tilted upward as the morning progresses, until direct light 24 is no longer in reach for the optical collection apparatus 10, at which time the optical collection apparatus 10 can stop tracking the sun 42 and only generate electric power from indirect light 26 impinging on the optical collection apparatus 10. If the window 38 is facing west, the solar collection units 19 will initially point upward in the beginning of the afternoon, and as the afternoon progresses, the solar collection units 19 will be tilted downward, following the path of the setting sun, until direct light 24 can no longer reach the first collection sides 16, at which time the optical collection apparatus 10 can stop tracking the sun 42 and only generate power from indirect light 26 impinging on the optical collection apparatus 10.

Figure 4:
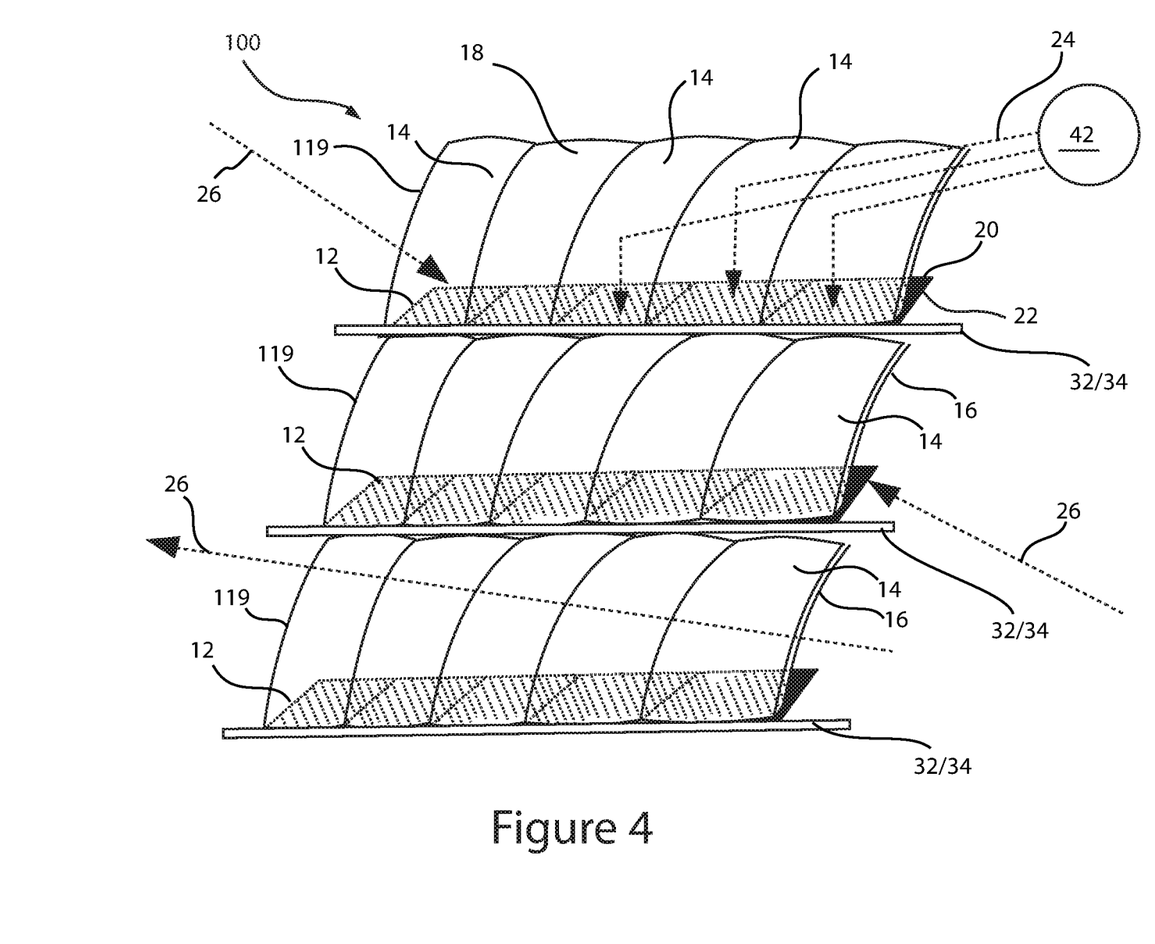
FIG. 4 is a perspective view of an optical collection apparatus in accordance with another embodiment.

Another embodiment of the optical collection apparatus is shown in FIG. 4 and denoted as an optical collection apparatus 100. In this embodiment, the optical collection apparatus 100 for collecting light from the sun 42 onto a plurality of bifacial solar cells 12 comprises fifteen light transmissive optical reflectors 14 and three bifacial solar cells 12. Each light transmissive optical reflector 14 has a first collection side 16 and a second collection side 18.

As described above, the bifacial solar cells 12 are elongated sheets or strips of substrate material, comprising photovoltaic material on their first photovoltaic sides 20 and on their second photovoltaic sides 22, such as crystalline silicon semiconductors, providing a capability to absorb light impinging on both sides 20, 22 of the bifacial solar cells 12 and generate power. In this embodiment, each solar cell 12 is attached to a subset of the light transmissive optical reflectors 14 such that the light transmissive optical reflectors 14 of that subset are stacked side by side horizontally and are in a fixed orientation relative to the solar cell 12. Thus, each solar cell 12 and the associated subset of light transmissive optical reflectors 14 form a solar collection unit 119. As can be seen in FIG. 4, the light transmissive optical reflectors 14 of the optical collection apparatus 100 are thus arranged in an array having rows and columns of the light transmissive optical reflectors 14. Each solar collection unit 119 (i.e., a string of optical reflectors 14 and a shared elongated solar cell 12 to which they are attached) is mounted on a rotation arm 34 for tilting the solar collection unit 119 such that direct light 24 impinging on the first collection sides 16 of each optical reflector 14 can be reflected towards the first photovoltaic side 20 of the corresponding bifacial solar cell 12. In this embodiment, three solar collection units 119 are stacked vertically and can be built into the building 40 (or other structure) as described previously.

A person skilled in the art would understand that modifications to the embodiment of FIG. 4 are possible, and necessary for specific applications, and the description of this embodiment is meant to be a mere example of an optical collection apparatus 100 of the present technology.

Figure 5:
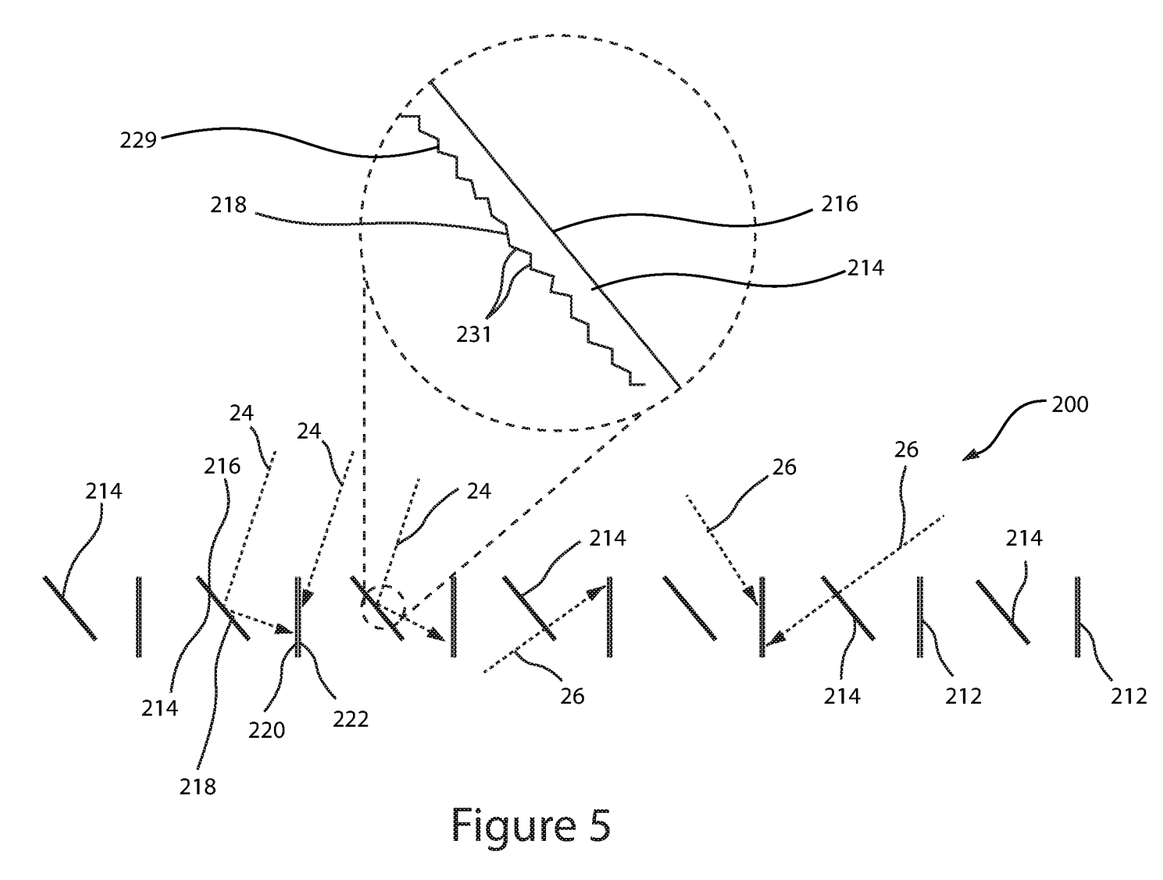
FIG. 5 is a cross sectional view of an optical collection apparatus in accordance with another embodiment.

With reference to FIG. 5, another embodiment of the optical collection apparatus is shown and denoted as an optical collection apparatus 200. As can be seen, the optical collection apparatus 200 can be oriented generally horizontally such that its bifacial solar cells are laterally adjacent to one another. As such, in this embodiment, the optical collection apparatus 200 can be disposed under a skylight of the building 40 (or alternatively can be used as the skylight of the building 40 in embodiments in which the optical collection apparatus 200 is encased in a light transmissive box, as will be described in greater detail below). A person skilled in the art would understand that modifications to the embodiment described below are possible, and necessary for specific applications, and the descriptions below are meant to be mere examples of an optical collection apparatus of the present technology.

FIG. 5 shows a cross-sectional view of the optical collection apparatus 200 for collecting sunlight onto a plurality of bifacial solar cells 212. The optical collection apparatus 200 comprises seven bifacial solar cells 212 and seven light transmissive optical reflectors 214 or redirecting elements. Each light transmissive optical reflector 214 comprises a first collection side or surface 216 and a second collection side or surface 218 opposite and generally parallel to one another. The second collection side 218 comprises a prismatic surface 229 which is highly reflective (by total internal reflection) when light impinges thereon at certain (direct) angles of incidence, and highly transmissive when light impinges thereon at other (indirect) angles of incidence. The second collection side 218 is designed to receive direct incoming light 24 impinging on the first collection side 216 and having traveled through the body of an optical reflector 214 and reflect this light back through the first collection side 216 towards the first photovoltaic side 220 of a corresponding bifacial solar cell 212. In this embodiment, the light transmissive optical reflectors 214 are planar optical elements (i.e., flat as opposed to curved) formed as elongated sheets comprising a prismatic microstructure 231 on the prismatic surface 229 which is designed to receive direct incoming light 24 impinging on the first collection side 216 of the optical reflectors 214 at angles of incidence which bring about total internal reflection on the second collection side 218 at the level of the microstructure 231, wherein direct light 24 is thereby redirected back through the first collection side 216 to the first photovoltaic side 220 of the corresponding bifacial solar cell 212. Details of the prismatic surface 229 can be seen in the zoomed-in view of FIG. 5. Direct light 24 which misses the optical reflectors 214 will impinge on the second photovoltaic side 222 of the bifacial solar cells 212 and be absorbed thereby, generating power.

The bifacial solar cells 212 are elongated sheets or strips of substrate material, comprising photovoltaic material on the first photovoltaic side 220 and on the second photovoltaic side 222, such as crystalline silicon semiconductors, providing a capability to absorb light impinging on both sides 220, 222 of the bifacial solar cells 212 and generate power. As can be seen in FIG. 5, in this embodiment, the widths of the bifacial solar cells 212 and the optical reflectors 214 are approximately the same. Each light transmissive optical reflector 214 is paired with a corresponding bifacial solar cell 212 and both the light transmissive optical reflectors 214 and the bifacial solar cells 212 are fixed in optimized positions which allow for efficient collection of solar light and power generation by the solar cells 212.

As previously mentioned, in practice, light is scattered in all directions by objects and surfaces in any environment, creating a background of indirect light 26. This indirect light 26 will also impinge on the first collection side 216 and on the second collection side 218 of the optical reflectors 214. The indirect light 26 will be transmitted through and out the opposite side of the optical reflectors 214, and some of the indirect light 26 will be absorbed by the first photovoltaic side 220 and by the second photovoltaic side 222 of the bifacial solar cells 212, as shown in FIG. 5, increasing the overall efficiency in power generation of the optical collection apparatus 200. Furthermore, some direct light 24, can miss the optical reflectors 214, but impinge directly on the second photovoltaic side 222 of a bifacial solar cell 212. Indirect light 26 can also pass straight through the reflectors 214 by transmission, providing natural illumination or distorted transparency. Because direct rays of light are collected by the system, this is also an efficient system for providing shade or illumination without glare.

Although the rays depicted in FIG. 5 are shown in two dimensions with negligible angles of refraction, it should be noted that some rays of indirect light 26 will be transmitted with considerable angles of refraction, and others will be refracted out of the depicted two-dimensional plane (out of the page).

Figure 6A:
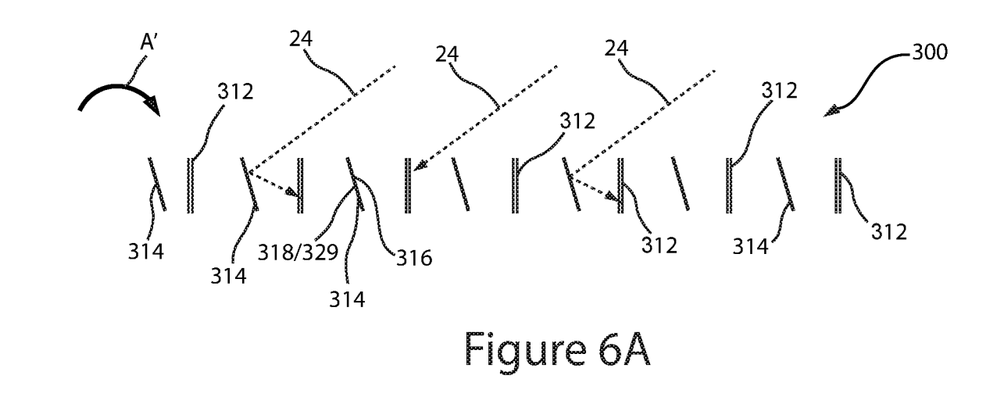
FIG. 6A is a cross sectional view of an optical collection apparatus in accordance with another embodiment, at a time where light transmissive optical reflectors thereof are tilted towards corresponding solar cells.
Figure 6B:
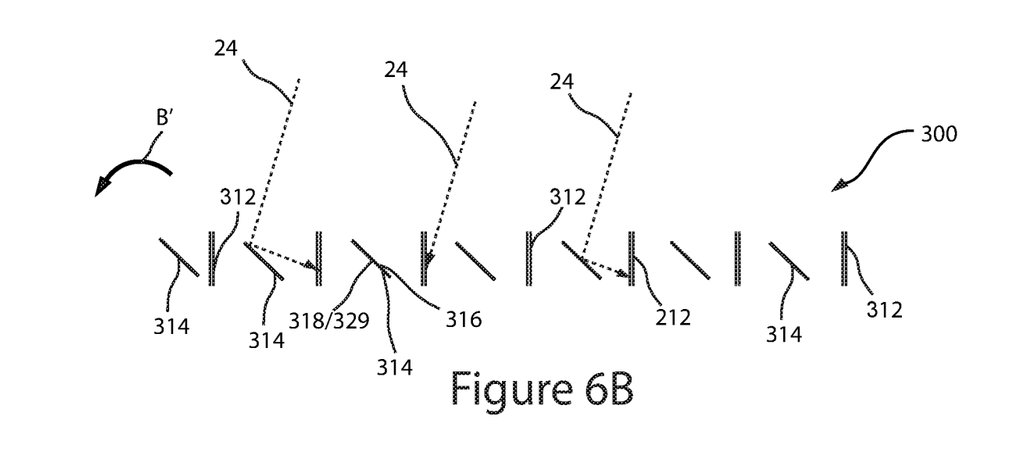
FIG. 6B is a cross sectional view of an optical collection apparatus of FIG. 6A, at a time where the light transmissive optical reflectors are tilted away from the corresponding solar cells.

With reference to FIGS. 6A and 6B, an optical collection apparatus 300 similar to the optical collection apparatus 200 is shown. As with the optical collection apparatus 200 of FIG. 5, in this embodiment, the optical collection apparatus 300 is configured for use under the skylight of the building 40 or as the skylight of the building 40. The optical collection apparatus 300 comprises optical reflectors 314 that can be tilted towards and away from the corresponding solar cells 312, such that the optical reflectors 314 can collect as much incoming direct light 24 as possible, and reflect this light 24 towards the first photovoltaic sides 320 of the corresponding bifacial solar cells 312.

The optical collection apparatus 300 of FIGS. 6A and 6B comprises seven bifacial solar cells 312 and seven light transmissive optical reflectors 314. Each light transmissive optical reflector 314 comprises a first collection side 316 and a second collection side 318. The second collection side 318 comprises a prismatic surface 329 which is highly reflective (by total internal reflection) when light impinges thereon at certain (direct) angles of incidence, and highly transmissive when light impinges thereon at other (indirect) angles of incidence.

The bifacial solar cells 312 are elongated sheets or strips of substrate material, comprising photovoltaic material on the first photovoltaic side 320 and on the second photovoltaic side 322, such as crystalline silicon semiconductors, providing a capability to absorb light impinging on both sides 320, 322 of the bifacial solar cells 312 and generate power.

In order for the optical collection apparatus 300 to reflect a higher amount of direct sunlight 24 towards the first photovoltaic side 320 of the bifacial solar cells 312, the light transmissive optical reflectors 314 can be tilted such that the first collection side 316 can face the direction of incoming rays of direct light 24, tracking the sun as it moves in the sky. In order to achieve proper orientation of the optical collection apparatus 300, each optical reflector 314 can be mounted on a corresponding single-axis tracking system with a motor system as described with respect to FIGS. 1-4, replicating the tilting system used for venetian blinds, or any other suitable system for repositioning the optical reflectors 314 can be implemented.

FIGS. 6A and 6B show the optical collection apparatus 300 at times A' and B' respectively, where the light transmissive optical reflectors 314 are tilted towards and away from the corresponding solar cells 312, in the directions shown by arrows A' and B'.

Although the optical collection apparatuses 200, 300 described and shown in FIGS. 5 to 6B comprise seven bifacial solar cells 212, 312 and seven optical reflectors 214, 314, a person skilled in the art would understand that this number of solar cells and light transmissive optical reflectors is exemplary, and that any useful number of optical reflectors 214, 314 and solar cells 212, 312 can be comprised in an optical collection apparatus.

Figure 7:
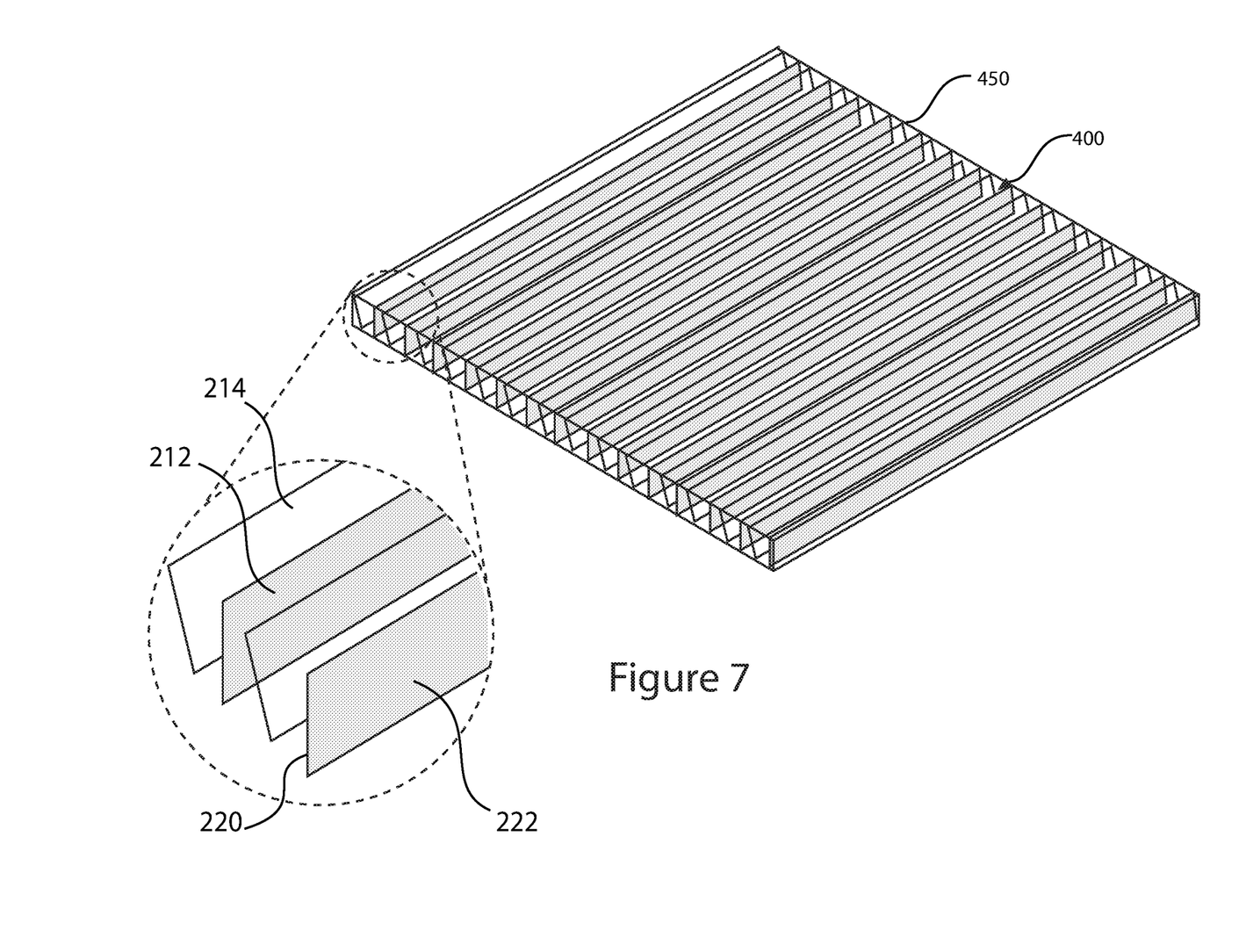
FIG. 7 is a perspective view of an optical collection apparatus in accordance with another embodiment.
Figure 8:
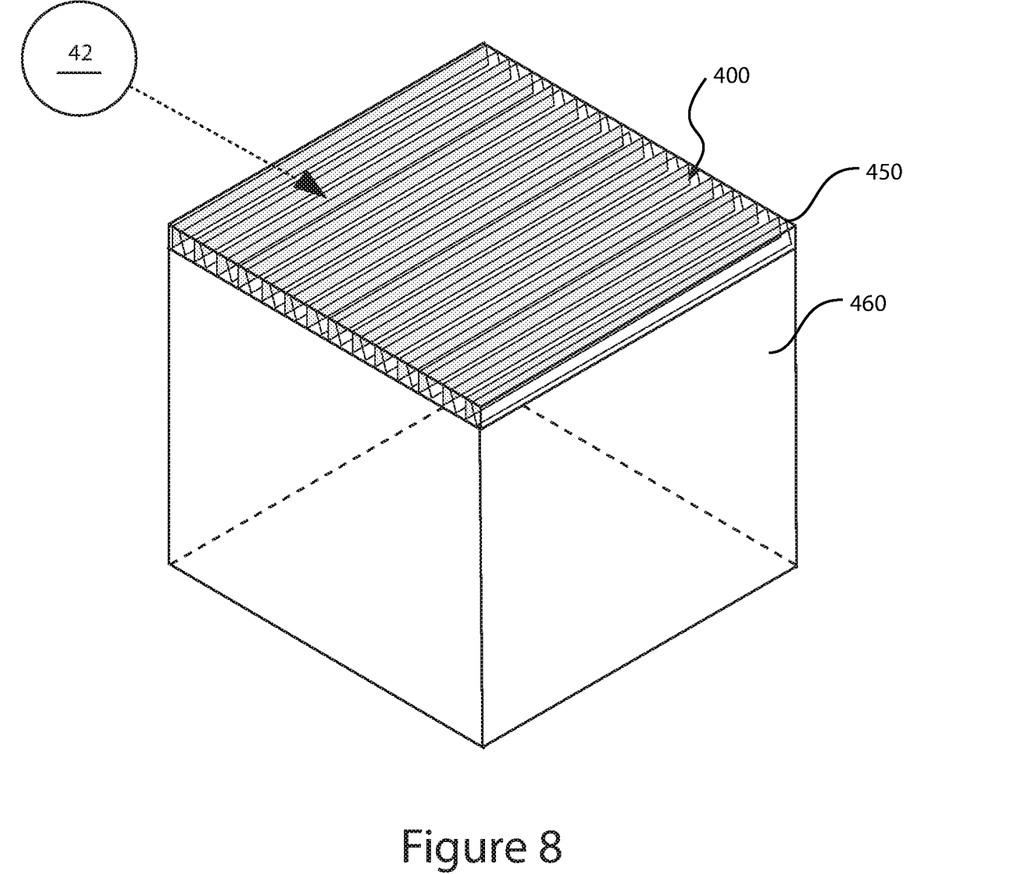
FIG. 8 is a perspective view of the optical collection apparatus of FIG. 7 mounted on the roof of a building.

Another embodiment of the optical collection apparatus, denoted as optical collection apparatus 400, is shown in FIGS. 7 and 8. In this embodiment, the optical collection apparatus 400 comprises the optical and mechanical structure of the optical collection apparatus 200 of FIG. 5, but comprises fourteen solar cells 212 instead of seven, and fourteen light transmissive optical reflectors 214 instead of seven. Furthermore, the optical collection apparatus 400 includes a light transmissive box 450 enclosing the bifacial solar cells 212 and the light transmissive optical reflectors 214 therein, which provides structure to the optical collection apparatus 400, and keeps moisture, dust, and debris away from the optical and electrical components. In this embodiment, the light transmissive box 450 is made of glass. It is contemplated that, in other embodiments, the light transmissive box 450 could be made of any other suitable material (e.g., polycarbonate or PMMA).

In this embodiment, the light transmissive optical reflectors 214 are elongated light transmissive optical reflectors 214, and the bifacial solar cells 212 are elongated solar cells 212. Furthermore, the bifacial solar cells 212 are elongated sheets or strips of substrate material, comprising photovoltaic material on the first photovoltaic side 220 and on the second photovoltaic side 222, such as crystalline silicon semiconductors, providing a capability to absorb light impinging on both sides 220, 222 of the bifacial solar cells 212 and generate power. FIG. 8 shows the optical collection apparatus 400 mounted on the roof of a structure 460. The optical collection apparatuses 200, 300, 400 of FIGS. 5 to 7 can be the skylight of a building, or disposed on the roof of a pergola.

Although embodiments have been described above with reference to the accompanying drawings, those of skill in the art will appreciate that variations and modifications may be made without departing from the scope thereof as defined by the appended claims.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. An optical collection apparatus comprising:
   a plurality of light transmissive optical reflectors, each light transmissive optical reflector comprising a first collection side and an opposite second collection side, each light transmissive optical reflector being configured to transmit indirect light impinging on the first and second collection sides thereof; and
   a plurality of planar bifacial solar cells, each bifacial solar cell comprising a first photovoltaic side and a second photovoltaic side, the first and second photovoltaic sides of each of the plurality of bifacial solar cells being positioned to collect indirect light impinging thereon, the planar bifacial solar cells of the plurality of planar bifacial solar cells being arranged such that at least one light transmissive optical reflector of the plurality of light transmissive optical reflectors is positioned between consecutive ones of the planar bifacial solar cells, each light transmissive optical reflector of the plurality of light transmissive optical reflectors being configured to:

reflect direct incoming light impinging on the first collection side thereof towards the first photovoltaic side of a corresponding one of the planar bifacial solar cells;

transmit indirect light impinging on the first and second collection sides through and out the other of the first and second collection sides towards the first photovoltaic side of the corresponding one of the planar bifacial solar cells;

transmit indirect light impinging on the first and second collection sides through and out the other of the first and second collection sides without subsequently impinging on the planar bifacial solar cells.

2. The optical collection apparatus of claim 1, wherein the second collection side of each of the light transmissive optical reflectors comprises an optical film configured to reflect direct light by total internal reflection towards the first photovoltaic side of the corresponding one of the bifacial solar cells.

3. The optical collection apparatus of claim 1, wherein the second collection side of each of the light transmissive optical reflectors comprises a patterned surface of prismatic micro-reflectors for reflecting direct light by total internal reflection towards the first photovoltaic side of the corresponding one of the bifacial solar cells.

4. The optical collection apparatus of claim 1, wherein each of the light transmissive optical reflectors is shaped and positioned to transmit indirect light impinging on the first collection side and on the second collection side to the first photovoltaic side of one of the bifacial solar cells.

5. The optical collection apparatus of claim 1, wherein the first collection side of each of the light transmissive optical reflectors is a concave side and the second collection side of each of the light transmissive optical reflectors is a convex side.

6. The optical collection apparatus of claim 1, wherein a cross-sectional profile of each of the light transmissive optical reflectors is curvilinear in shape.

7. The optical collection apparatus of claim 1, wherein the light transmissive optical reflectors are planar elongated sheets of light transmissive material.

8. The optical collection apparatus of claim 1, wherein:

the plurality of light transmissive optical reflectors includes a plurality of subsets of light transmissive optical reflectors; and for each subset of light transmissive optical reflectors of the plurality of subsets of light transmissive optical reflectors:

the light transmissive optical reflectors are disposed side by side horizontally; and the light transmissive optical reflectors are attached to a common one of the planar bifacial solar cells and are in a fixed position with respect to the common one of the planar bifacial solar cells.

9. The optical collection apparatus of claim 1, wherein:

each of the light transmissive optical reflectors is arranged in a fixed position with respect to the corresponding one of the bifacial solar cells to form a plurality of solar collection units; and the solar collection units of the plurality of solar collection units are vertically adjacent to one another.

10. The optical collection apparatus of claim 1, wherein:

each of the light transmissive optical reflectors is arranged in a fixed position with respect to the corresponding one of the bifacial solar cells; and the light transmissive optical reflectors are arranged in an array having rows and columns of the light transmissive optical reflectors.

11. The optical collection apparatus of claim 1, further comprising a transparent case for enclosing the plurality of light transmissive optical reflectors and the plurality of planar bifacial solar cells therein.

12. The optical collection apparatus of claim 1, wherein the optical collection apparatus is configured to be mounted on a single-axis tracking system for positioning the light transmissive optical reflectors such that the first collection sides thereof face the sun in order to receive direct incoming light therefrom.

* * * * *